(12) United States Patent  
Ciccarelli et al.

(10) Patent No.: US 7,463,055 B2
(45) Date of Patent: Dec. 9, 2008

(54) SWITCH BLOCK AND CORRESPONDING SWITCH MATRIX, IN PARTICULAR FOR FPGA ARCHITECTURES

(75) Inventors: Luca Ciccarelli, Rimini (IT); Carlo Chiesa, Bologna (IT); Andrea Lodi, Castel San Pietro (IT); Roberto Giansante, Pescara (IT); Mario Toma, Tuglie (IT); Fabio Campi, Zola Preppsa (IT)

(73) Assignee: STMicroelectronics S.R.L., Agrate Brianza (MI) (IT)

( * ) Notice: Subject to any disclaimer, the term of this patent is extended or adjusted under 35 U.S.C. 154(b) by 41 days.

(21) Appl. No.: 11/215,301

(22) Filed: Aug. 30, 2005

(65) Prior Publication Data

US 2006/0103420 A1     May 18, 2006

(30) Foreign Application Priority Data

Aug. 30, 2004   (IT)  ............................ MI2004A1675

(51) Int. Cl.
*H03K 19/173*     (2006.01)
(52) U.S. Cl. .......................................... 326/38; 326/41
(58) Field of Classification Search ............. 326/37–41, 326/47
See application file for complete search history.

(56) References Cited

U.S. PATENT DOCUMENTS

| 5,600,264 | A | * | 2/1997 | Duong et al. | .................. 326/39 |
| 5,841,827 | A | * | 11/1998 | Chevallier | ..................... 377/20 |
| 6,590,419 | B1 | * | 7/2003 | Betz et al. | ...................... 326/47 |

* cited by examiner

*Primary Examiner*—James H Cho
(74) *Attorney, Agent, or Firm*—Lisa K. Jorgenson; Bryan A. Santarelli; Graybeal Jackson LLP

(57) ABSTRACT

A switch block suitable to realize the connection between interconnection lines connected thereto of the type comprising at least a switching block connected to the interconnection lines and including at least a buffer stage in turn connected to a plurality of transistors. The switch block comprises a decoding stage inserted between a plurality of SRAM cells and respective control terminals of the plurality of transistors of the switching block.

16 Claims, 13 Drawing Sheets

SWITCH BLOCK AND CORRESPONDING SWITCH MATRIX, IN PARTICULAR FOR FPGA ARCHITECTURES

PRIORITY CLAIM

This application claims priority from Italian Application No. MI2004A 001675, filed Aug. 30, 2004, which is incorporated herein by reference.

TECHNICAL FIELD

Embodiments of the present invention relate to a switch block.

More specifically, embodiments of the invention relate to a switch block suitable to realize the connection between interconnection lines connected thereto of the type comprising at least a switch block connected to said interconnection lines and including at least a buffer stage in turn connected to a plurality of transistors.

Embodiments of the present invention also relate to a switch matrix.

In particular, embodiments of the invention relate to a switch block and to a switch matrix for re-programmable interconnections of so-called multi-context Programmable Gate Arrays architectures (FPGA) and the following description is made with reference to this field of application by way of illustration only.

BACKGROUND

As it is well known in this specific technical field, during the last ten years, the use of FPGA architectures has been a valid solution for a multiplicity of tasks.

In the meanwhile, the applications realized by such FPGA architectures have become so much more and more complex that they comprise many different algorithms which are implemented by a same FPGA architecture in different moments.

To increase the possibilities of using FPGA architectures, the possibility of run-time reconfiguration, i.e. during the operation of the architecture itself, has been introduced, in particular by reprogramming the gate arrays comprised in the architecture.

A typical configuration of an FPGA architecture is schematically shown in FIG. 1 and globally indicated with 1. The FPGA architecture 1 essentially comprises a plurality of programmable logic elements 2 arranged in a matrix-like configuration, commonly indicated as gate arrays, each of such programmable logic elements 2 being connected, by means of a plurality of local connections 3, to an interconnection network 4, in turn comprising a plurality of horizontal interconnection lines 4a and vertical interconnection lines 4b.

As shown in FIG. 1, each programmable logic element 2 of the gate array essentially comprises a look-up table 5 having a plurality of inputs and being connected to an output through a multiplexer 6 having in turn an input connected to a memory element 7.

In particular, the interconnection network 4 allows to reconfigure the FPGA architecture 1, changing the operation thereof.

FIG. 2 schematically shows a detail of the FPGA architecture 1, in particular a programmable logic element 2 and its connections to the interconnection network 4.

The programmable logic element 2 is connected to a horizontal connection block 8a and to a vertical connection block 8b in turn connected to a switch matrix or switch block 10.

The connection blocks 8a and 8b as well as the switch block 10 comprise a plurality of connection lines 9.

As shown in FIG. 2, a SRAM memory cell 11 is connected to each intersection of the connection lines 9, such cell driving a MOS transistor 12 to program the interconnections of the programmable logic element 2 inside the gate matrix of the FPGA architecture 1.

In FPGA architectures of this type, the area occupation and the propagation delay are essentially linked to the connection blocks and to the programmable switch blocks. Moreover, such switch blocks are extremely complex.

In particular, a complete reconfiguration of an FPGA architecture as described typically requires several hundreds of clock cycles and thus causes delays which considerably affect the overall performances of the system the FPGA architecture is part of.

To limit the delays due to the reconfiguration time of the FPGA architectures, multi-context FPGA architectures have been thus recently proposed able to store different configurations inside the gate array of the architecture itself, allowing context switching in a very short time. In such architectures, different contexts coexist of which only one is active. The switching from a context to another causes the change of the FPGA architecture operation.

An FPGA architecture 30 of the multi-context type is schematically shown in FIG. 3. In particular, the multi-context FPGA architecture 30 comprises a plurality of configurations, in the example shown equal to four configurations indicated with 30a-30d, ready to be used. Only one of such configurations, in particular a first configuration 30a, is active.

The passage from a pre-stored configuration to another thus occurs in very short periods of time.

This advantage is not however without costs: each SRAM cell used to store configuration bits in a multi-context FPGA architecture is typically replicated by a number equal to that of the stored contexts, as schematically shown in FIG. 4, where it is highlighted that a plurality of SRAM cells 11a-11d are comprised in each switch block 10.

A multi-context FPGA architecture is described for example in the article "A Time-Multiplexed FPGA" to S. Trimberger et al. (Xilinx Inc.).

In essence, by using a multi-context FPGA architecture a great increase of the area occupation of the architecture itself occurs, which causes an increase of the length of the interconnection lines which in turn affects the delays and the power consumption, in a more and more significant way with the reduction of the integration technology scale.

Since the increase of the area occupation and of the delays is essentially due to the high number of interconnections which realize the programmability of the FPGA architecture, the efforts in the field have been addressed to their configuration.

Thus, the interconnections represent a more and more important key requirement for re-programmable architectures, where devices such as pass transistors, three-state buffers or multiplexers, increase the area occupation and the capacitive load on the wires or connectors, affecting the overall performance.

As already seen, the switch blocks 10 are also of particular importance, being responsible for the connection between the horizontal interconnection lines 4a and the vertical interconnection lines 4b. It is possible to state that the FPGA architecture reconfigurability and a significant part of the delays due to the interconnections are related to such switch blocks 10.

It is known to realize such switch blocks 10 by means of a configuration with six pass-transistors, described for example in the U.S. Pat. No. 4,870,302 issued on Sep. 26, 1989 to Xilinx, Inc. and schematically shown in FIG. 5A.

In particular, once four directions are identified with N, E, S, W, the switch block 10A comprises in fact six pass transistors 13 connected to respective pairs of directions, in particular to the directions N-E, E-S, S-W, W-N, N-S and W-E. Each pass-transistor 13 has a control terminal connected to a respective SRAM cell 11.

Although advantageous from a flexibility and small area occupation point of view, such a switch block 10A architecture has a high interconnection delay due to the serial connections of the pass-transistors comprised therein.

Such delay is unacceptable when the technological integration scale of the devices comprising the FPGA architectures at issue, wherein the delay time portion due to the interconnection mechanism is more and more preponderant, increases.

For such reason, solutions for switch blocks have been recently proposed wherein the technologies linked to the pass-transistors and to the three-state buffers are associated, as described for example in the U.S. Pat. No. 4,835,418 issued on May 30, 1989 to Xilinx Inc. and schematically shown in FIG. 5B.

In FIG. 5B, a switch block 10B is particularly shown comprising six bi-directional three-state buffers 14, each comprising a pair of buffers driven by respective SRAM cells 11a, 11b and connected to each other in a crossed way. As in the switch block 10A of FIG. 5A, the bi-directional three-state buffers 14 of the switch block 10B are also connected to respective pairs of directions, in particular to the directions N-E, E-S, S-W, W-N, N-S and W-E.

Such a solution, although reducing the propagation delay thanks to the absence of pass-transistors in series with each other, has the drawback of needing a large integration area due to the dimensions of the buffers and to the number of SRAM cells, doubled with respect to the switch block 10A.

Other circuit solutions are known to realize switch blocks by means of bi-directional three-state buffers as described in the U.S. Pat. No. 5,600,264 issued on Feb. 4, 1997 and U.S. Pat. No. 5,760,604 issued on Jun. 2, 1998, both to Xilinx, Inc.

In any case, the circuit solutions proposed by the prior art comprise switch blocks with three-state buffers requiring two configuration bits to determine both the on/off state and the signal direction, and are thus inefficient in terms of area occupation, which is linked to the number of SRAM cells in the device. Known solutions are thus essentially dedicated to reducing the number of three-state buffers and of SRAM cells comprised in the switch blocks.

In this perspective, the solution described in U.S. Pat. No. 5,376,844 issued on Dec. 27, 1994 to Altera Corp. has been developed, wherein multiplexing blocks are used to reduce the number of SRAM cells necessary to realize the programming of the interconnections in an FPGA architecture.

Although advantageous in several aspects, such a known solution also has problems linked to the area occupation, in particular in the case of FPGA architectures of the multi-context type, wherein SRAM memory cells are typically multiplied by the number of the configurations pre-stored in the FPGA architecture itself.

SUMMARY

An embodiment of the present invention is directed to a circuit structure suitable to realize a switch block and a corresponding switch matrix able to combine area reduction and optimal speed performances for programmable interconnections in FPGA architectures. This approach has remarkable advantages in the case of architectures of the multi-context type.

The structure of a switch matrix for FPGA architectures is simplified by introducing, in each switch block comprised therein, a decoding stage inserted between the configuration memory elements or SRAM cells and a real switch block suitable to properly drive the elements comprised in such switch block, so as to reduce the number of SRAM cells necessary for the multi-context memorization, succeeding, in such way, in remarkably reducing the area occupation, without affecting the latency of the signals which pass through such switch matrix.

Another embodiment of the present invention is directed to a switch block suitable to realize the connection between interconnection lines connected thereto of the type comprising at least a switch block connected to said interconnection lines and including at least a buffer stage in turn connected to a plurality of transistors. Advantageously, the switch block comprises a decoding stage inserted between a plurality of SRAM cells and respective control terminals of said plurality of transistors of said switch block.

A further embodiment is directed to a switch matrix suitable to execute the connection between at least three horizontal connection paths and three vertical connection paths.

In particular, the switch matrix according to an embodiment of the invention comprises:
  at least a first T-switch block to connect a first vertical interconnection line and a second vertical interconnection line of a first vertical connection path to a first central node of a first horizontal connection path;
  at least a second L-switch block to connect a second central node of a second vertical connection path and a third central node of a second horizontal connection path; and
  at least a third T-switch block to connect a first horizontal interconnection line and a second horizontal interconnection line of a third horizontal connection path to a fourth central node of a third vertical connection path.

A still further embodiment of the present invention is directed to an interconnection network of a plurality of programmable logic elements connected by means of a plurality of vertical and horizontal connection paths advantageously comprising a plurality of switch matrices being identical to each other and organized in a matrix system with rows and columns, each switch matrix configuring at least three horizontal connection paths and three vertical connection paths in a scheme which is repeated as such in all said addressing network.

Finally, another embodiment of the present invention is directed to an FPGA architecture of the type comprising a plurality of elementary blocks comprising at least a programmable logic element and arranged in a matrix structure organised in rows and columns, each programmable logic element being connected to a horizontal interconnection block and to a vertical interconnection block. Advantageously, the vertical and horizontal interconnection blocks are connected to each other by T-switch matrixes.

BRIEF DESCRIPTION OF THE DRAWINGS

The features and the advantages of the switch block, the switch matrix, the interconnection network and the FPGA architecture according to the invention will be apparent from the following description of embodiments given by way of non-limiting example with reference to the attached drawings.

Figure 1:
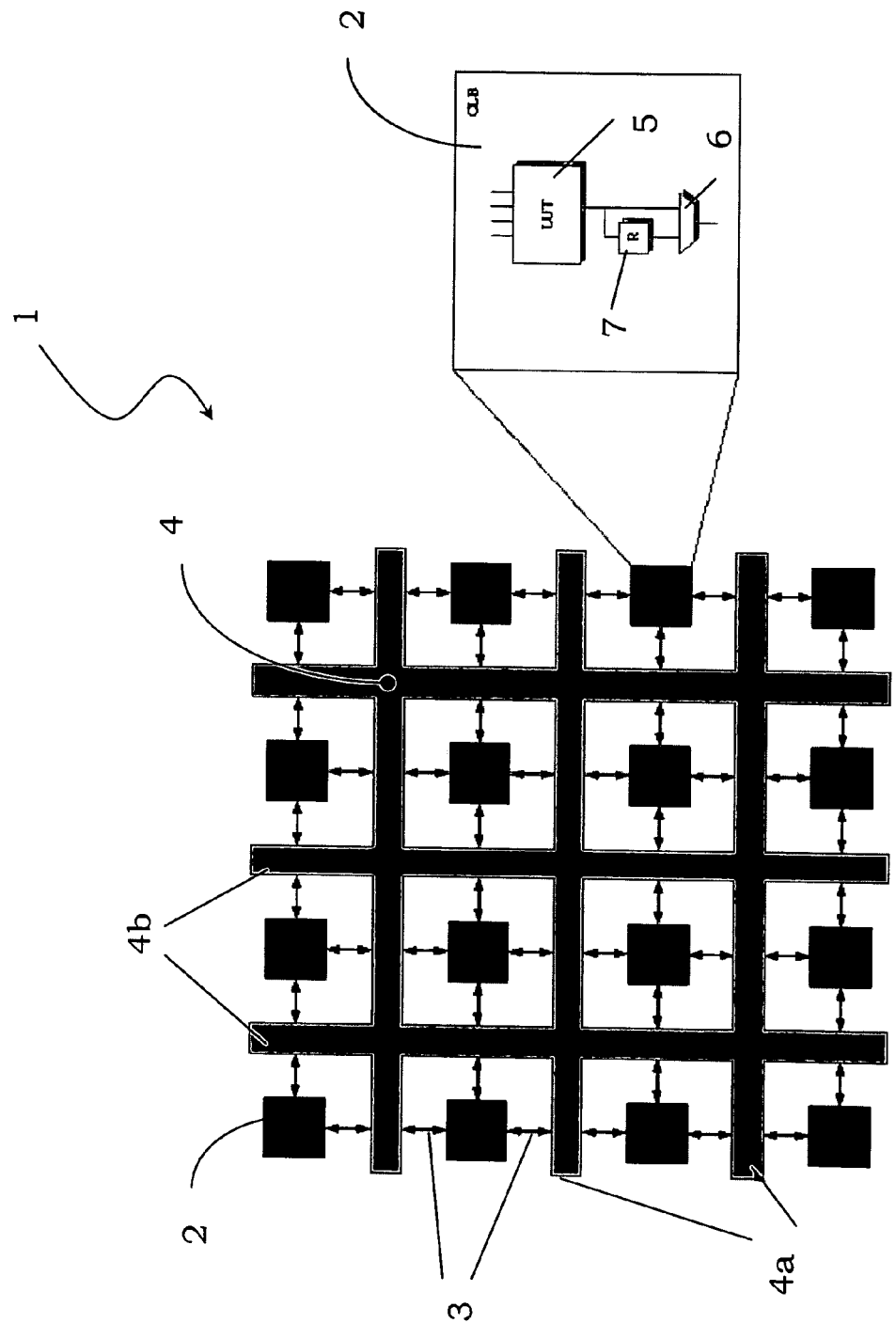
FIG. 1 schematically shows an FPGA architecture realized according to the prior art.
Figure 2:
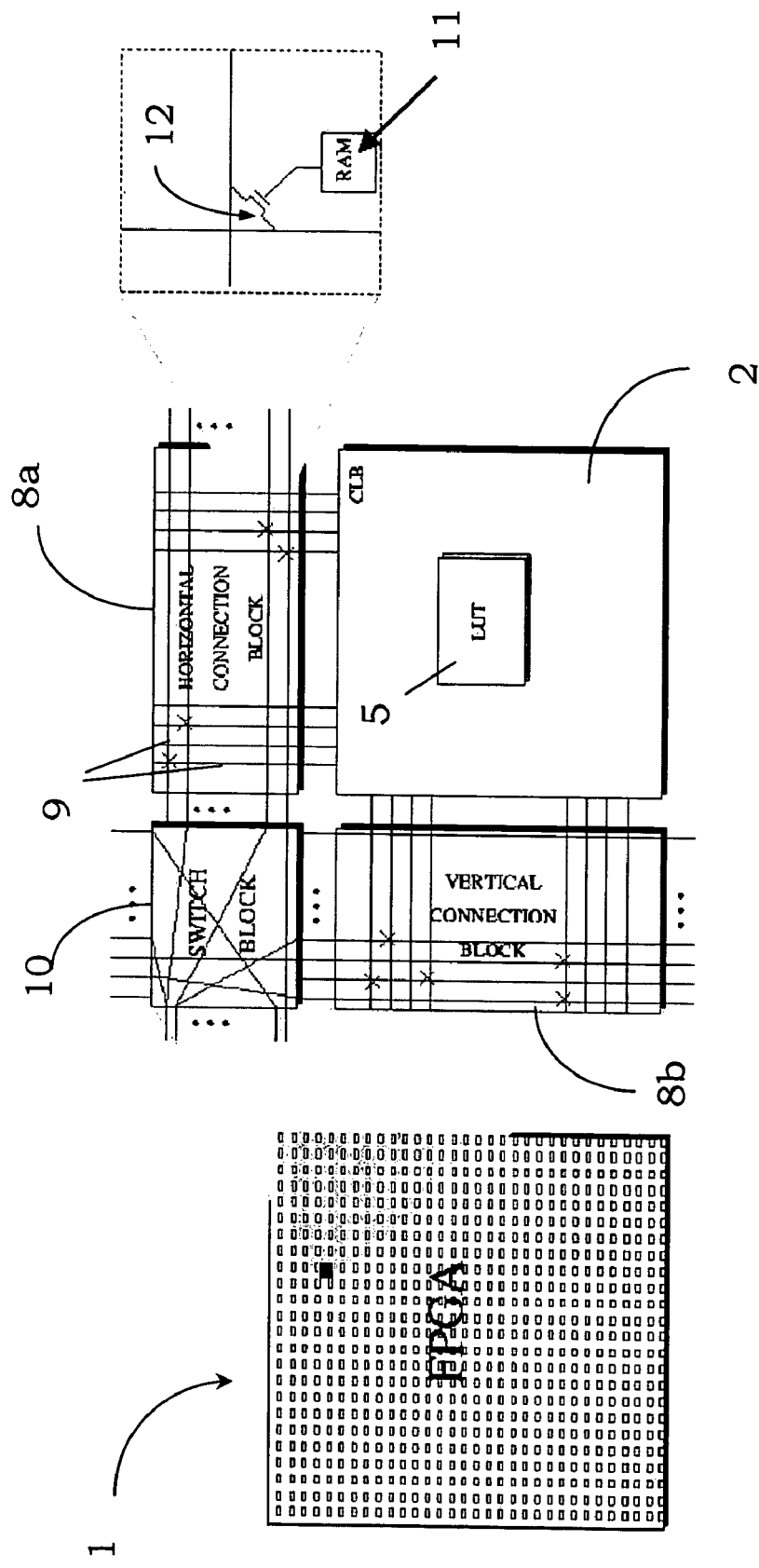
FIG. 2 schematically shows a detail of the FPGA architecture of FIG. 1.
Figure 4:
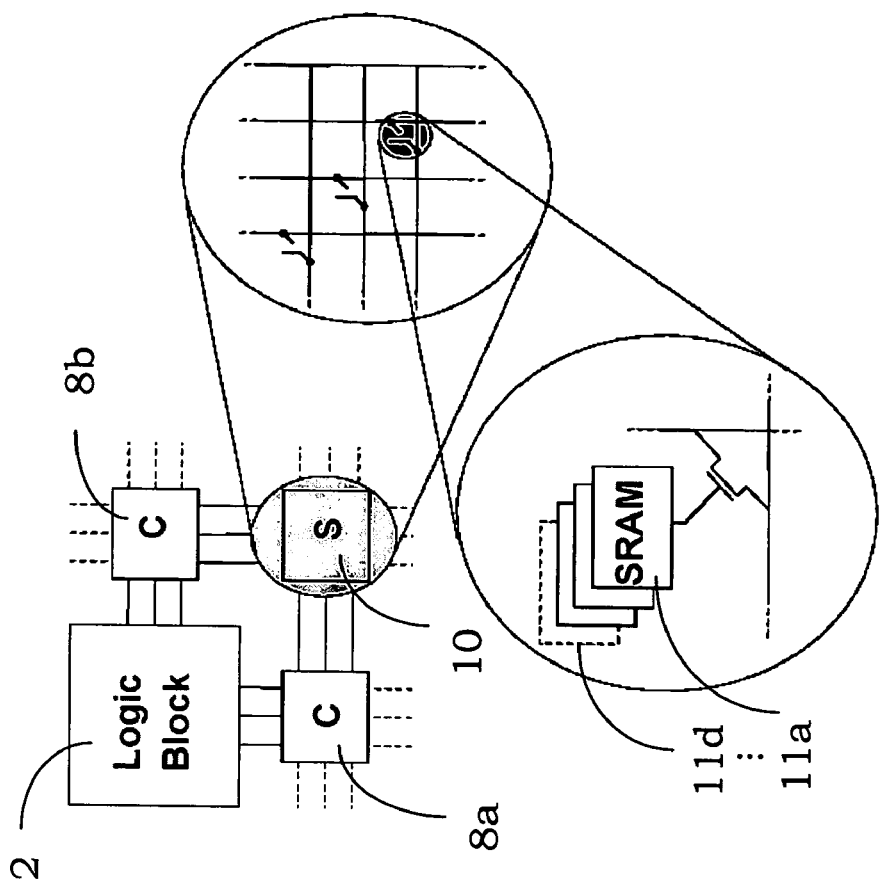
FIG. 4 schematically shows a detail of the FPGA architecture of FIG. 3.
Figure 3:
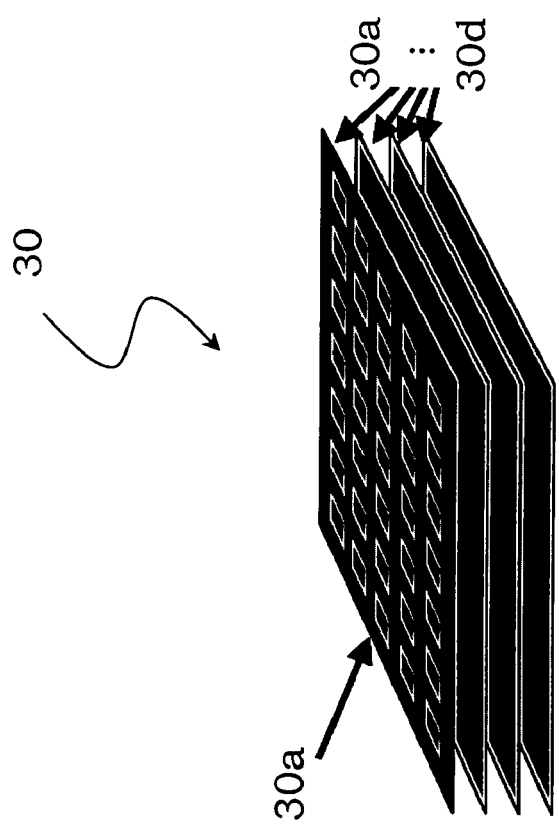
FIG. 3 schematically shows a multi-context FPGA architecture realized according to the prior art.
Figure 5B:
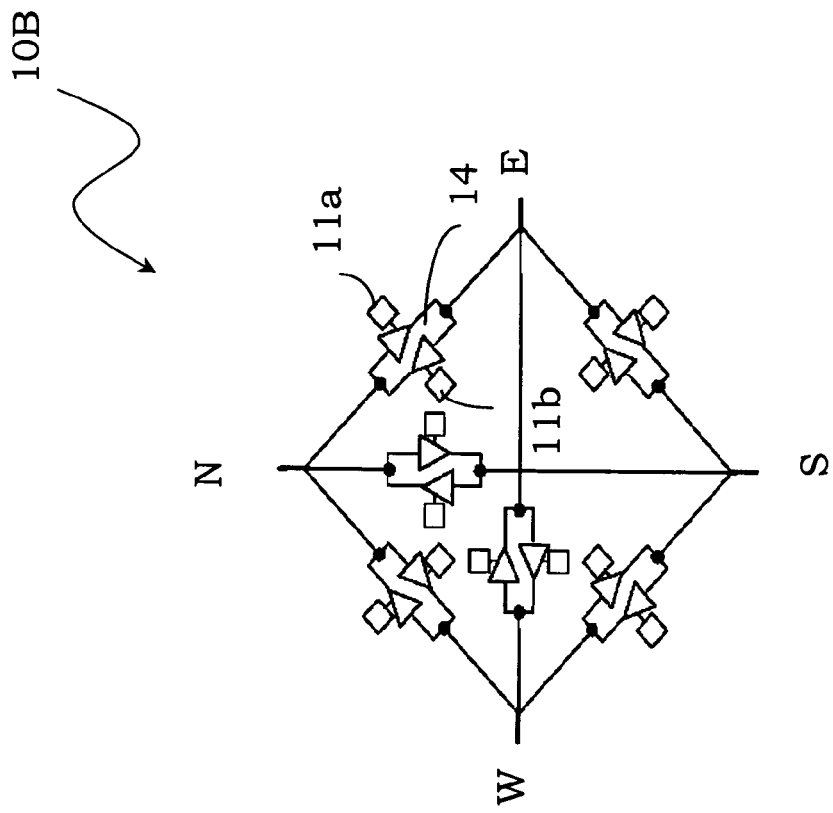
FIGS. 5A and 5B schematically show a first and a second embodiment, according to the prior art, of a switch block contained in FPGA architectures.
Figure 5A:
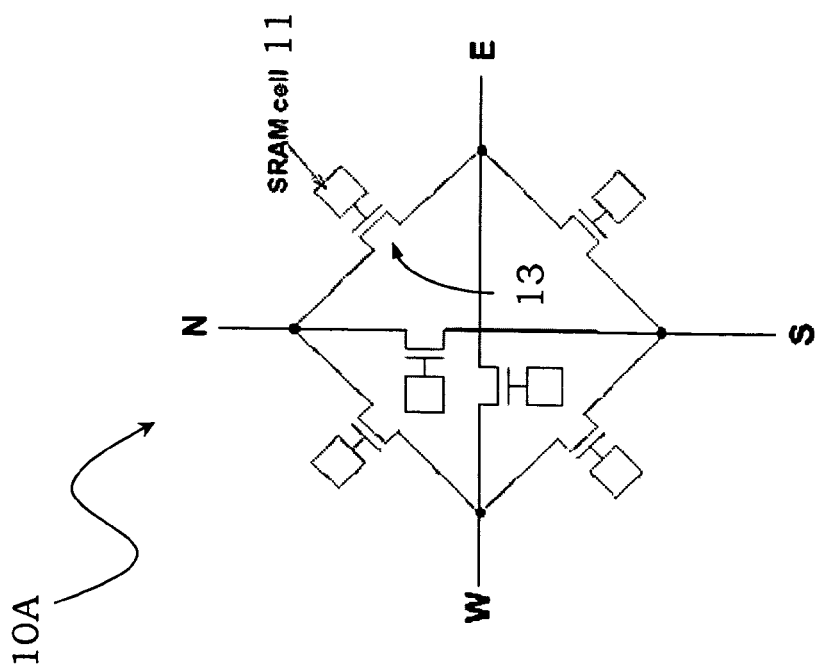
Figure 6:
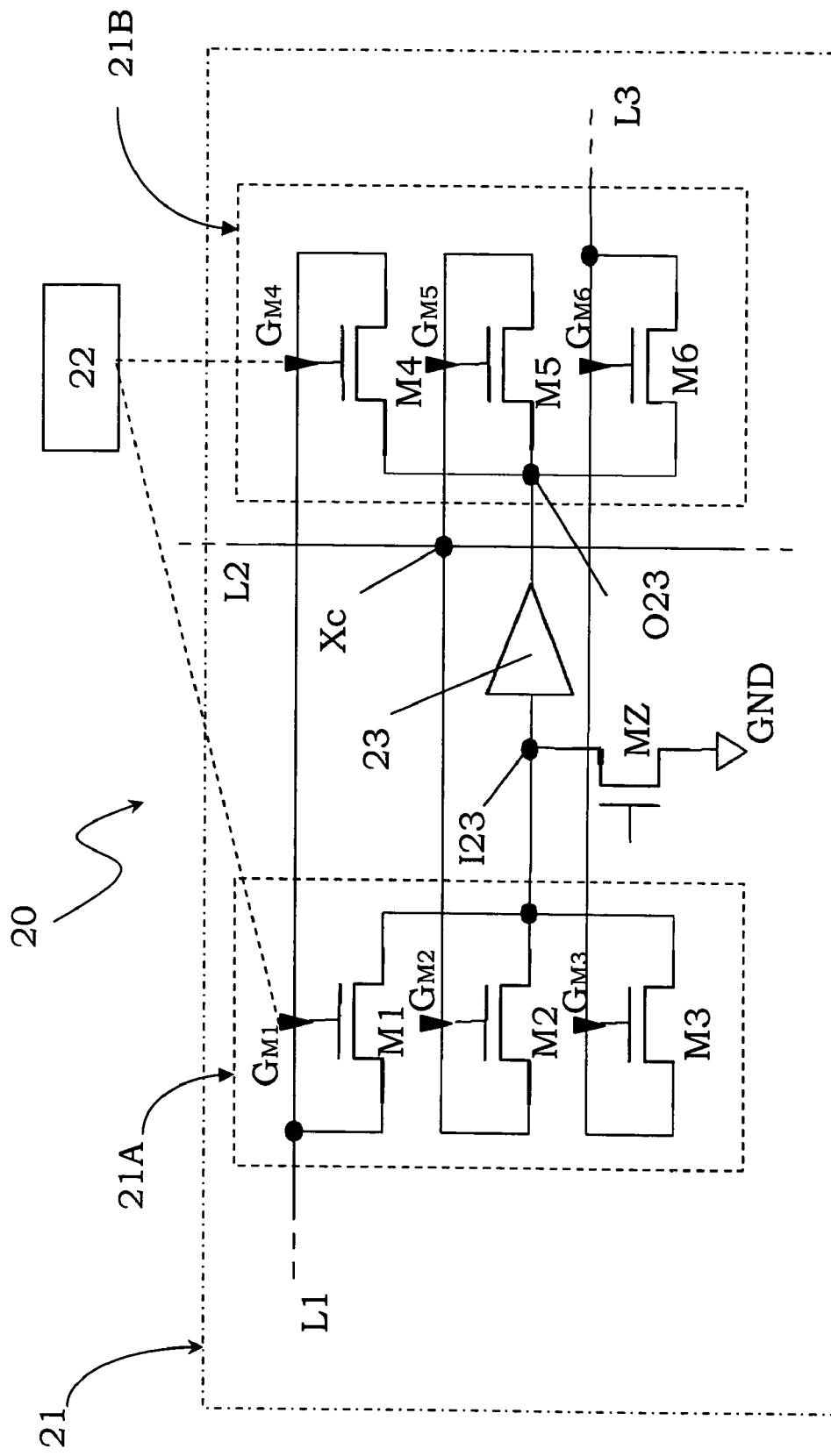
FIG. 6 schematically shows a switch block for FPGA architectures realized according to an embodiment of the present invention.

FIGS. from 7A to 7C schematically show possible switch matrixes which can be realized by composing switch blocks of FIG. 6 or switch blocks of FIGS. 5A and 5B.

Figure 7A:
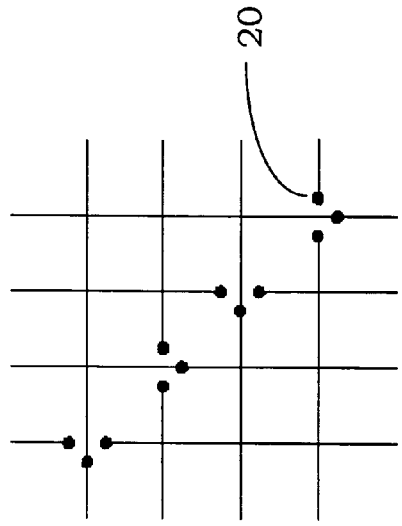
Figure 7B:
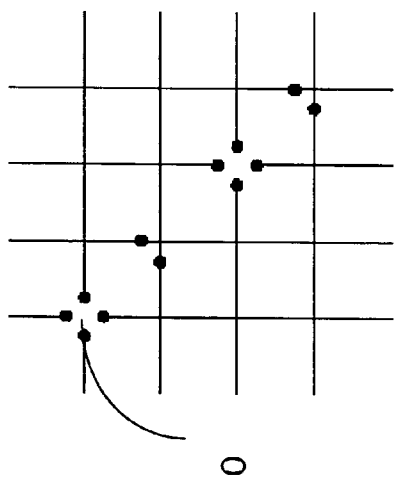
Figure 7C:
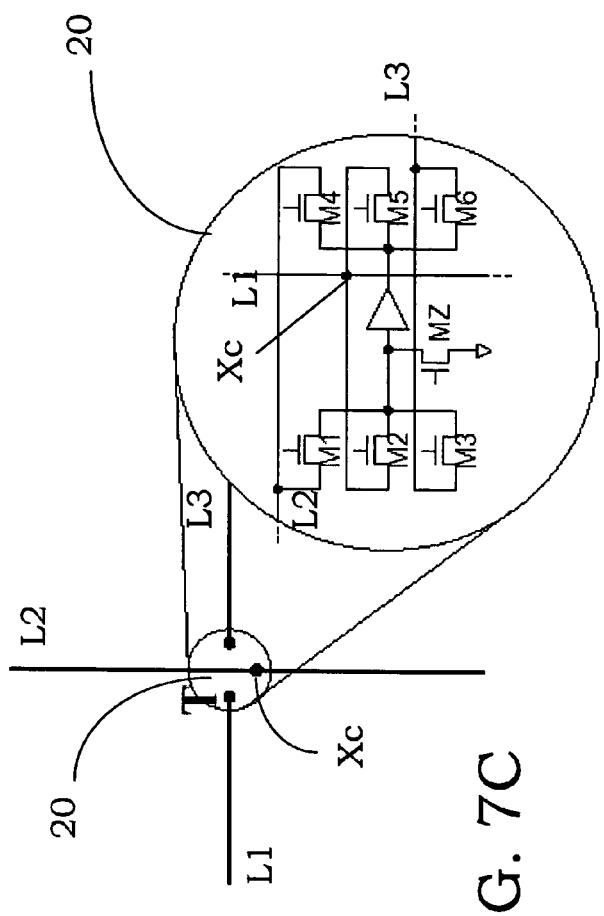
Figure 8:
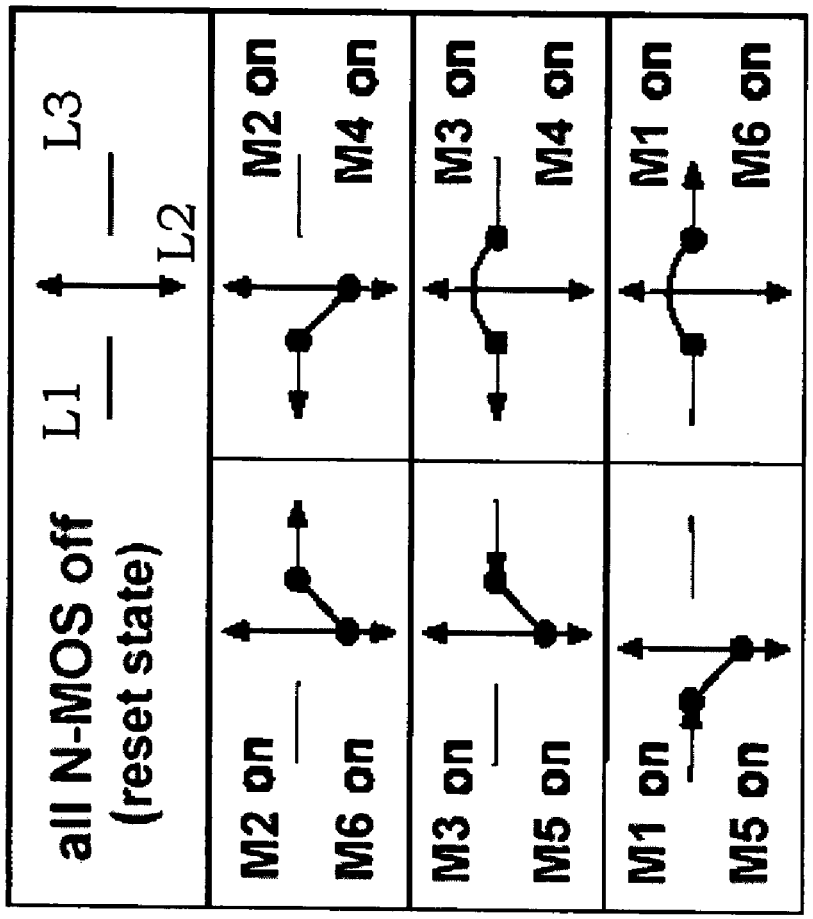

FIG. 8 schematically shows different operative conditions of the switch block of FIG. 6 corresponding to the possible configurations of the switch matrix of FIG. 7C.

Figure 9B:
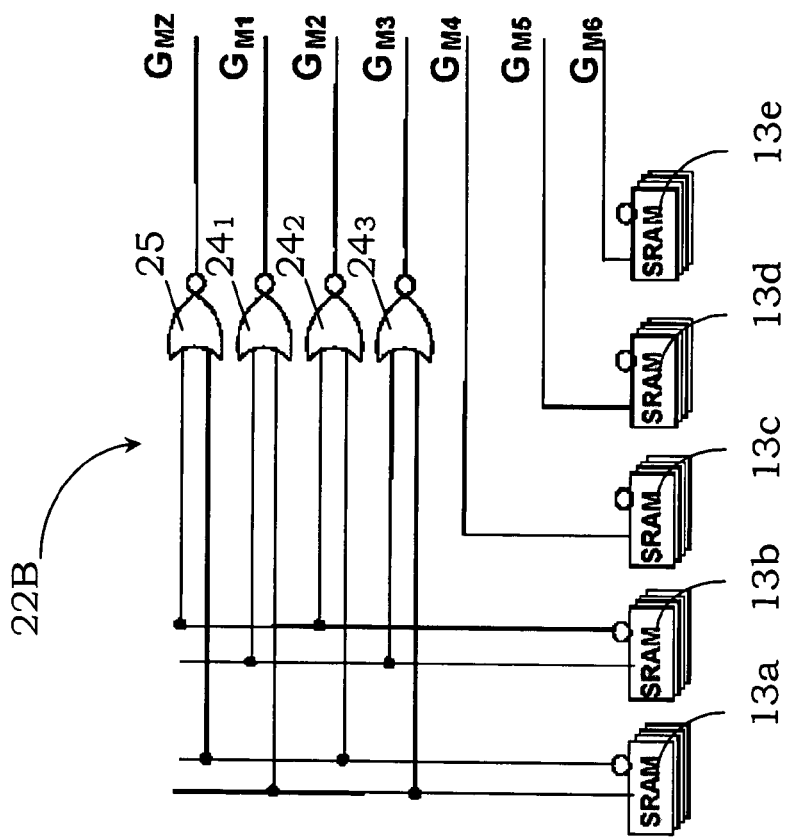
Figure 9A:
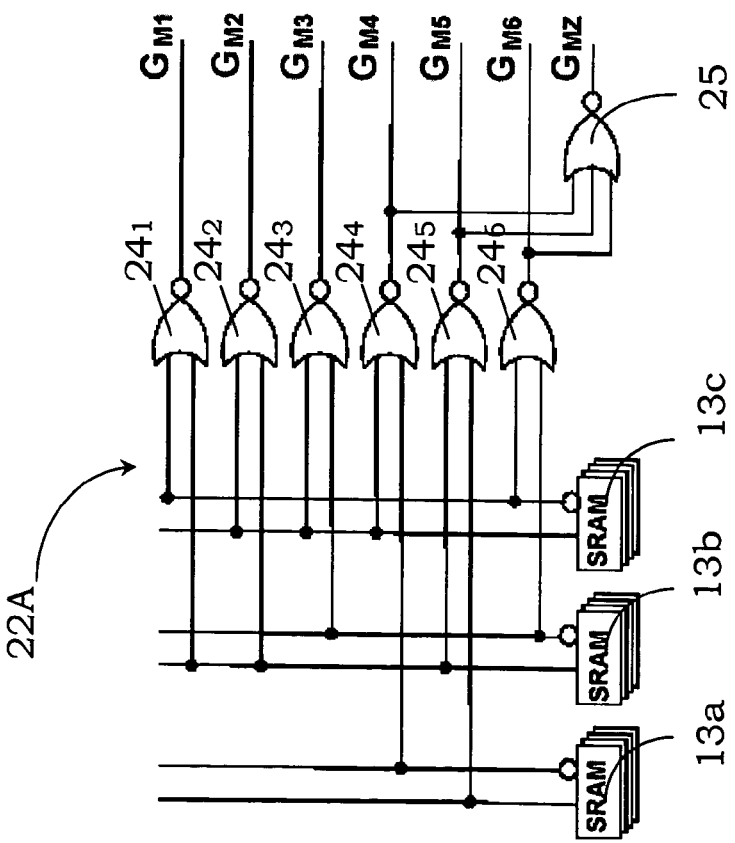

FIGS. 9A and 9B schematically show two embodiments of a detail of the switch block of FIG. 6.

Figure 10:
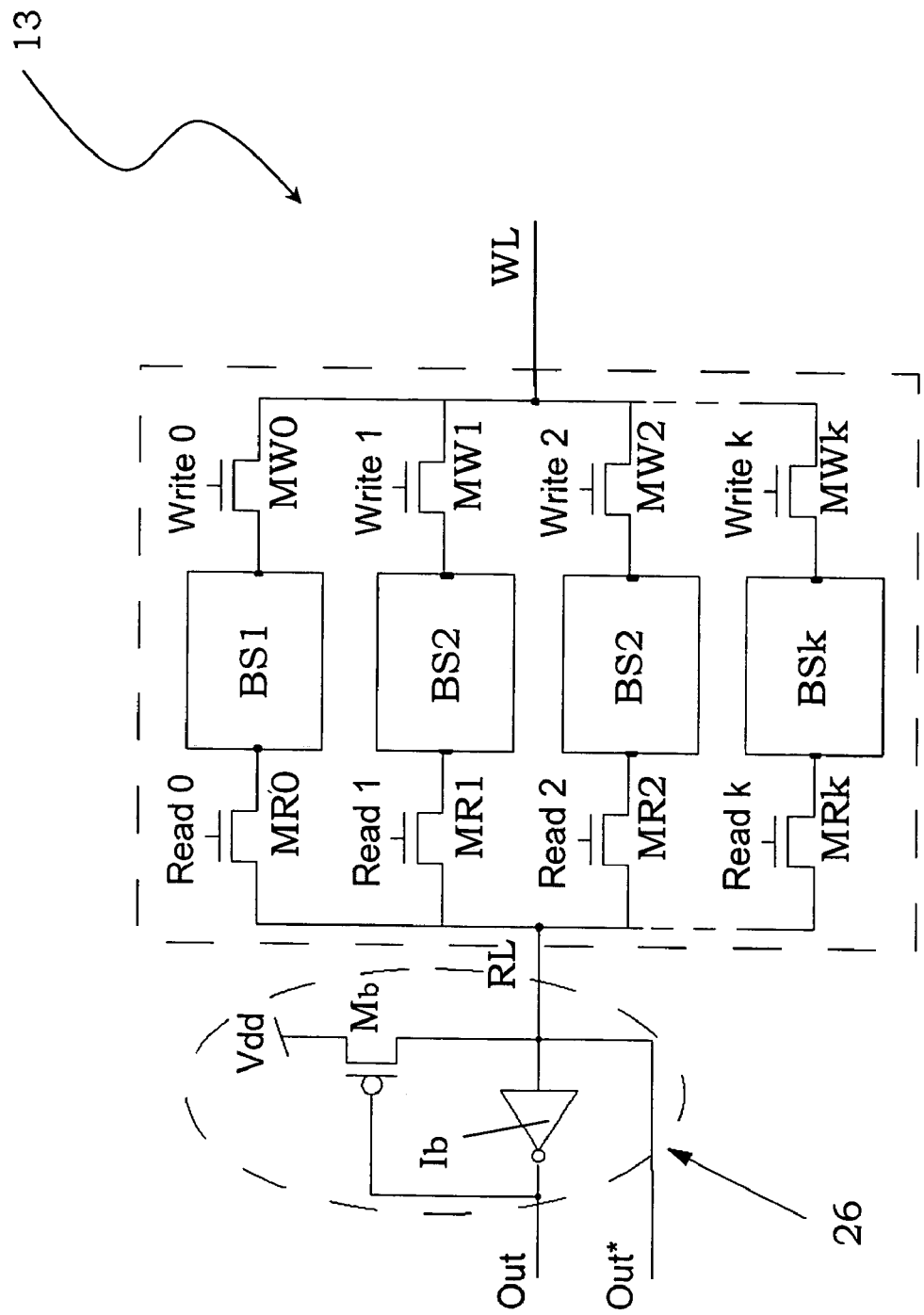

FIG. 10 schematically shows a multi-context SRAM cell contained in the switch block of FIG. 6.

Figure 11:
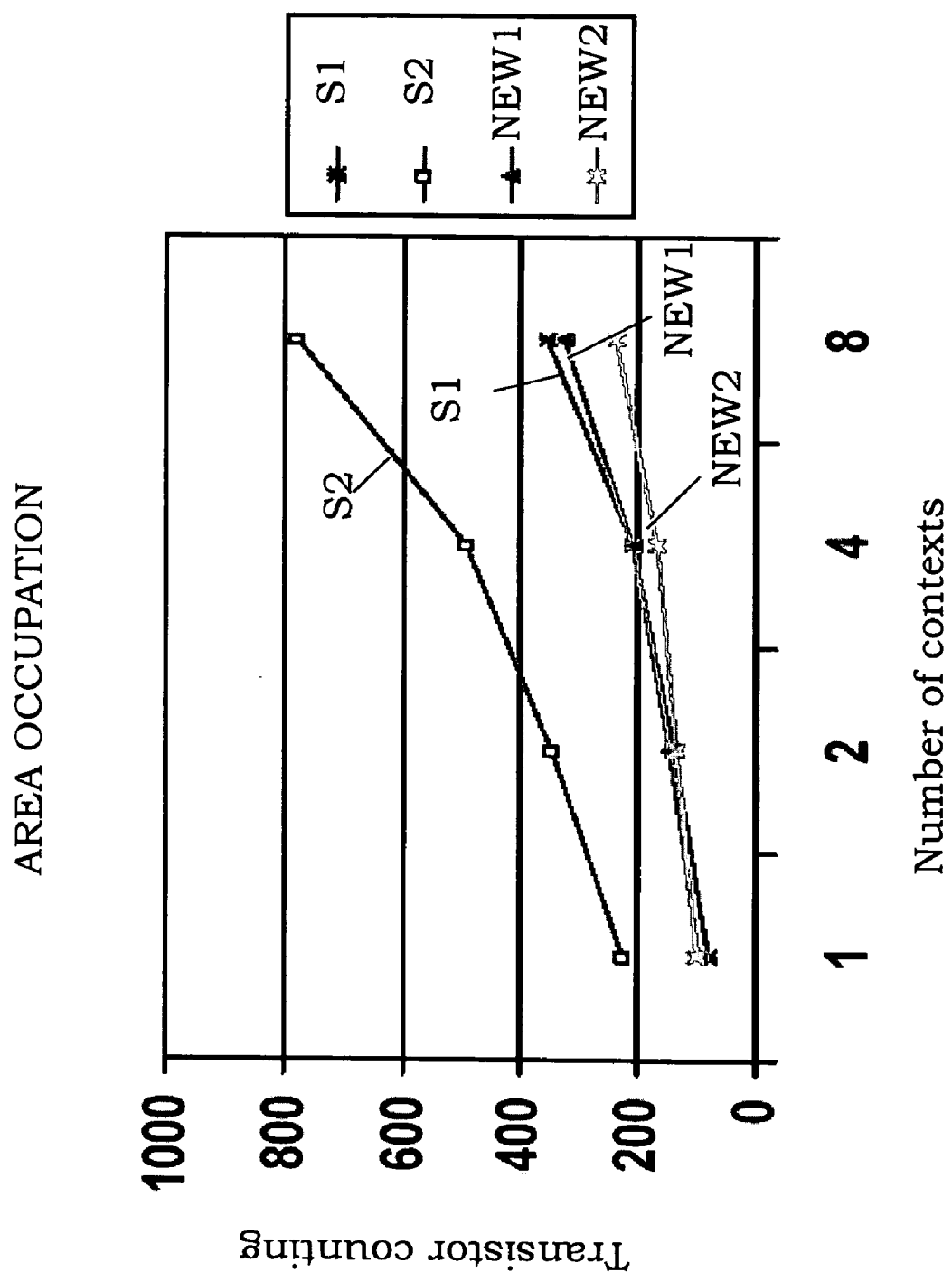

FIG. 11 shows the variation of the area occupation when the number of contexts of switch blocks realized according to the prior art and according to an embodiment of the invention grows.

Figure 12:
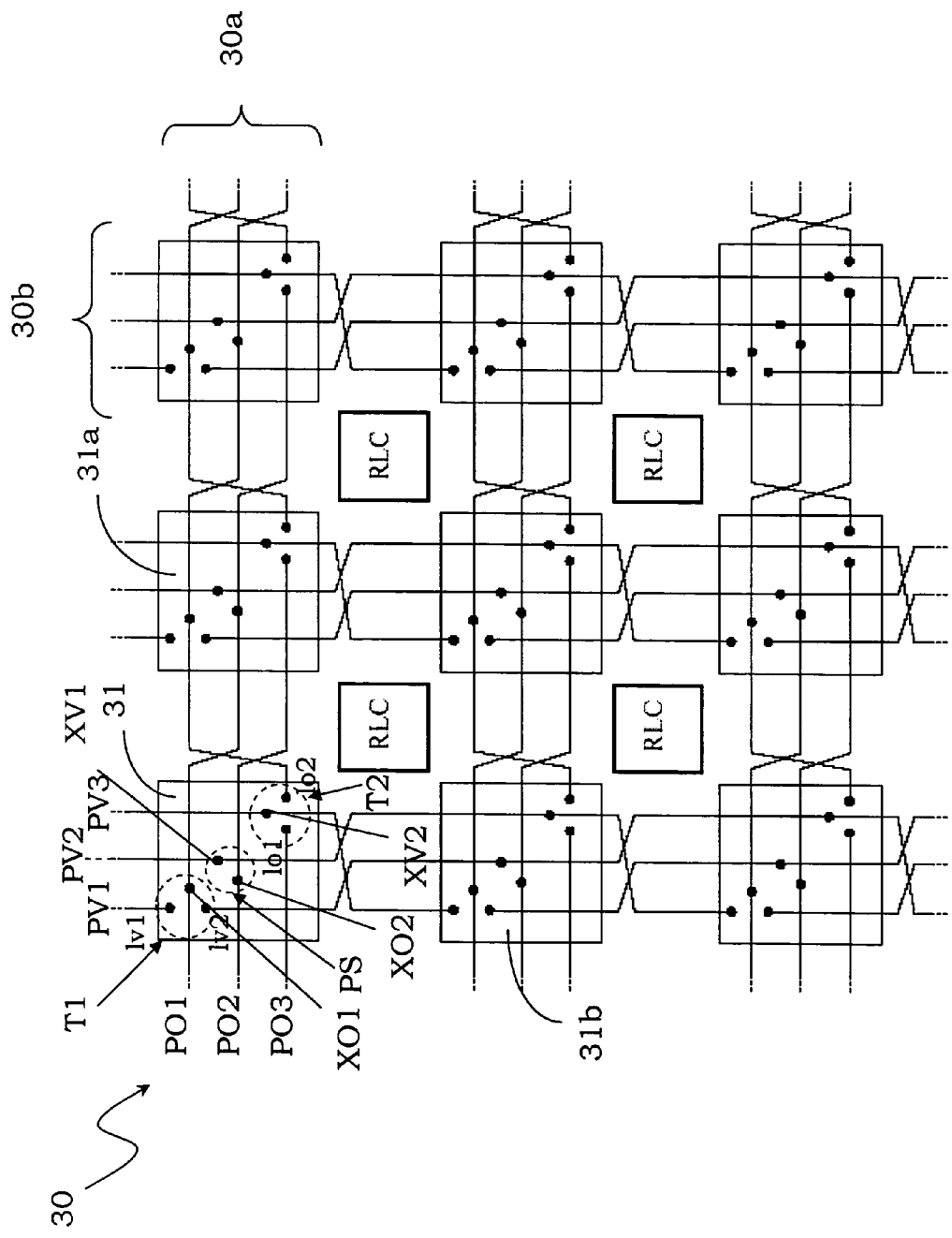

FIG. 12 schematically shows an interconnection network realized according to an embodiment of the invention.

Figure 13:
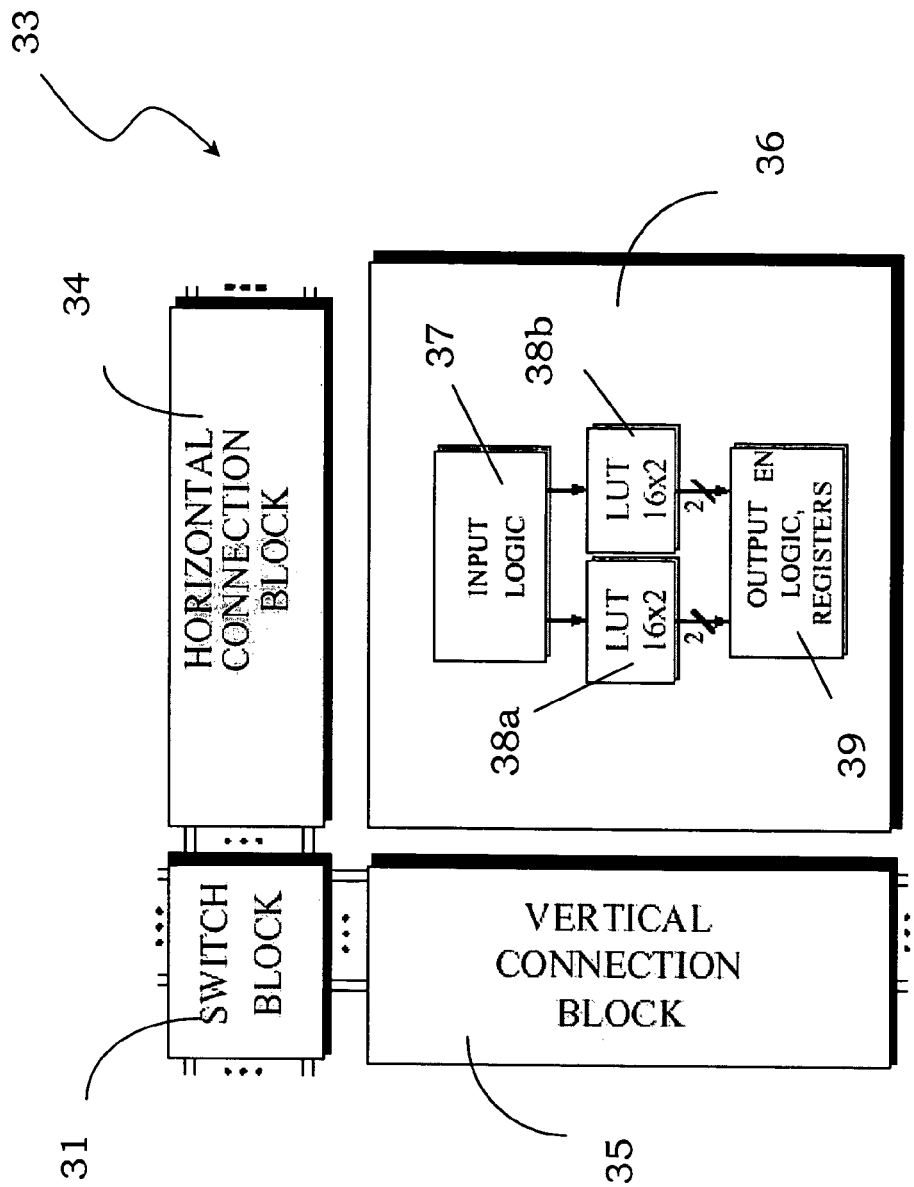

FIG. 13 schematically shows an elementary block of an FPGA architecture realized according to an embodiment of the invention.

Figure 14B:
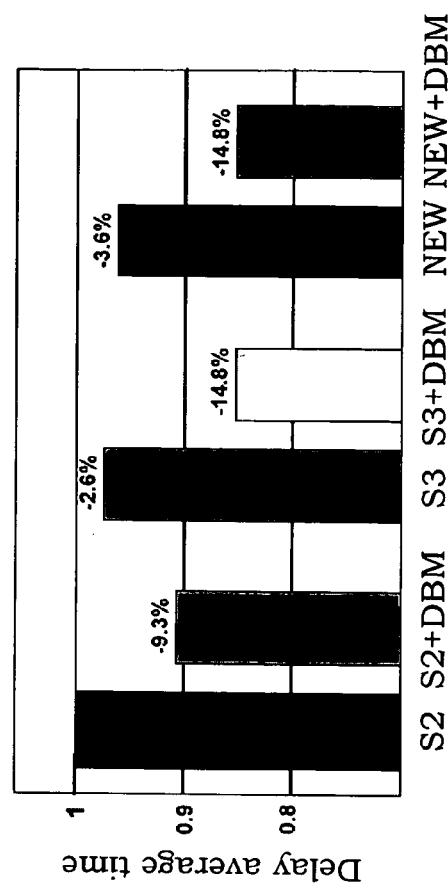
Figure 14A:
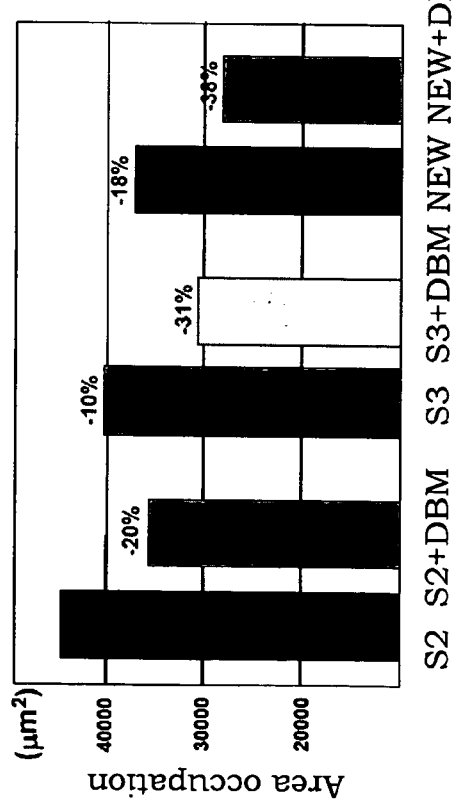

FIGS. 14A and 14B show the results of experimental tests executed on switch blocks realized according to the prior art and according to an embodiment of the invention.

DETAILED DESCRIPTION

Making now reference to the attached figures and in particular to FIG. 6, a switch block realized according to an embodiment of the present invention is globally and schematically indicated with 20.

In particular, such switch block 20 is suitable to be inserted in FPGA architectures already described in relation to the prior art. Moreover, the switch block 20 can be advantageously used in the FPGA architectures of the multi-context type, also described in relation to the prior art.

Hereafter in the description, for sake of simplicity, functionally and structurally identical elements will be indicated with the same reference numbers used in the description of the FPGA architectures according to the prior art.

Advantageously, the switch block 20 comprises a real switching block, indicated with 21, which essentially includes six transistors, in particular pass transistors indicated with M1-M6, but a single buffer stage 23. Moreover, the switch block 20 comprises a pull-down transistor indicated with MZ, suitable to avoid high impedance node conditions at the input of the buffer stage 23.

The transistors of the switching block 21 are advantageously controlled by a plurality of SRAM cells 13 by means of a decoding stage 22, as it will be shown hereafter.

In particular, making reference to FIG. 6, the switch block 20 realizes the connection between a first L1, a second L2 and a third line L3.

To do this, the switching block 21 of the switch block 20 comprises a first transistor stage 21A inserted between the first line L1 and an input terminal I23 of the buffer stage 23 and connected to a central node Xc of the second line L2, as well as to the third line L3.

In particular, the first transistor stage 21A comprises:
  a first transistor M1 inserted between the first line L1 and the input terminal I23 of the buffer stage 23;
  a second transistor M2 inserted between the central node Xc of the second line L2 and the input terminal I23 of the buffer stage 23; and
  a third transistor M3 inserted between the third line L3 and the input terminal I23 of the buffer stage 23.

In a symmetrical way with respect to the buffer stage 23, the switching block 21 of the switch block 20 also comprises a second transistor stage 21B inserted between an output terminal O23 of the buffer stage 23 and the third line L3 and connected to the central node Xc of the second line L2, as well as to the first line L1.

In particular, the second transistor stage 21B comprises:
  a fourth transistor M4 inserted between the first line L1 and the output terminal O23 of the buffer stage 23;
  a fifth transistor M5 inserted between the central node Xc of the second line L2 and the output terminal O23 of the buffer stage 23; and
  a sixth transistor M6 inserted between the third line L3 and the output terminal O23 of the buffer stage 23.

All the transistors M1-M6 have respective control or gate terminals $G_{M1}$-$G_{M6}$ connected to the decoding stage 22 (the single connection lines have not been inserted in the figure so as not to burden the complexity of the same).

Finally, the switching block 21 comprises the pull down transistor MZ inserted between the input terminal I23 of the buffer stage 23 and a voltage reference, in particular ground GND.

Also the pull down transistor MZ has a gate terminal $G_{MZ}$ connected to the decoding stage 22. In particular, the pull down transistor MZ forces the input of the buffer stage 23 to ground when there are no signals on its input terminal I23, avoiding a condition of high impedance thereof, which would lead the voltage on the input terminal I23 of the buffer stage 23 to an undetermined value, causing current static absorptions by the buffer stage 23 and remarkably increasing the power consumption of the whole switch block.

In the embodiment shown, all the transistors comprised in the switching block 21 are of the NMOS type.

It is to be noted that the switch block 20 is substantially a T-switch block which connects end points of vertical or horizontal interconnection lines (L1, L3) with intermediate points (Xc) of others (L2), as schematically shown in FIG. 7B. It is thus not possible to connect end points of interconnection lines being orthogonal to each other, as it occurred with the configurations of switch blocks 10 realized according to the prior art and as schematically shown in FIG. 7A.

In particular, as it has been previously described and as shown in FIG. 7C, the switch block 20 connects the intermediate points of the first line L1 and of the third line L3 to the central node Xc of the second line L2.

In essence, the switch block 20 enables to implement six different types of connection between three converging interconnection lines by switching on and off the transistors comprised therein, according to the scheme described in FIG. 8. In this example, the switch block 20 has the following operative conditions:
  connection wherein the signal on the second line L2 is propagated onto the third line L3 when the second transistor M2 and the sixth transistor M6 are on;

connection wherein the signal on the third line L3 is propagated onto the second line L2 when the third transistor M3 and the fifth transistor M5 are on;

connection wherein the signal on the first line L1 is propagated onto the second line L2 when the first transistor M1 and the fifth transistor M5 are on;

connection wherein the signal on the second line L2 is propagated onto the first line L1 when the second transistor M2 and the fourth transistor M4 are on;

connection wherein the signal on the third line L3 is propagated onto the first line L1 when the third transistor M3 and the fourth transistor M4 are on; and connection wherein the signal on the first line L1 is propagated onto the third line L3 when the first transistor M1 and the sixth transistor M6 are on.

In fact, the switch block 20 not only controls the connection between the interconnection lines connected thereto, but also the direction of such connection. In this sense, the connection from the first line L1 to the second line L2 is distinct from the connection from the second line L2 to the first line L1 and it is controlled by the switching-on of different transistors inside the switching block 21.

As previously seen, to obtain a correct driving of the transistors M1-M6 comprised in the switching block 21, the switch block 20 advantageously comprises the decoding stage 22 interposed between the gate terminals of such transistors M1-M6 and the SRAM cells 13 containing the configuration information of the FPGA architecture wherein such switch block 20 is inserted.

A first embodiment of a decoding stage is schematically shown in FIG. 9A, globally indicated with 22A. Such a realization uses three configuration bits, i.e. three SRAM cells 13a, 13b, 13c, each SRAM cell being of the multi-context type shown in FIG. 10.

The decoding stage 22A comprises a plurality of logic gates 24i having two inputs and being connected between the SRAM cells 13 and the gate terminals of the transistors M1-M6 comprised in the switching block 21 of the switch block 20 as well as a single logic gate 25 with three inputs connected at the input to the output terminals of three of the logic gates with two inputs and at the output to the gate terminal of the pull down transistor MZ. In such way, it is possible to minimize the area occupied by the decoding stage 22A and thus to minimize the impact on the integration area of the switch block 20, which is always a critical parameter, especially in the case considered of use in FPGA architectures.

In particular, in the example shown in FIG. 9A, the decoding stage 22A comprises six logic gates $24_1$-$24_6$ having a first and a second input terminal connected, in an alternate way, to the SRAM cells 13a, 13b and 13c and respective output terminals connected to the gate terminals $G_{M1}$-$G_{M6}$ of the transistors M1-M6 comprised in the switching block 21.

Moreover, the logic gate 25 with three inputs is connected to the output terminals of the logic gates driving the gate terminals of the transistors M4-M6 comprised in the second transistor stage 21B, in turn connected to the output terminal O23 of the buffer stage 23.

Advantageously, in fact, the switch block 20 comprising such a decoding stage 22A realizes, though suitable combinations of values for the three configuration bits, seven different types of connection between the interconnection lines connected thereto and it enables to reconfigure a multi-context FPGA architecture by using only three SRAM cells 13, each of them being of the multi-context type.

The decoding stage as schematically shown in FIG. 9B, globally indicated as 22B can also be realized.

In such an embodiment, the decoding stage 22B comprises a first 13a and a second SRAM cell 13b, connected, by means of three logic gates $24_1$-$24_3$ to the gate terminals of the transistors M1-M3 of the switching block 21.

In particular, in the example shown in FIG. 9B, the logic gates $24_1$-$24_3$ have a first and a second input terminals connected, in an alternate way, to the SRAM cells 13a and 13b and respective output terminals connected to the gate terminals $G_{M1}$-$G_{M3}$ of the transistors M1-M3 comprised in the first transistor stage 21A, in turn connected to the input terminal I23 of the buffer stage 23.

Moreover, the decoding stage 22B of FIG. 9B comprises three other SRAM cells 13c, 13d and 13e directly connected to the gate terminals $G_{M4}$-$G_{M6}$ of the other three transistors M4-M6 comprised in the second transistor stage 21B, in turn connected to the output terminal O23 of the buffer stage 23.

Finally, according to such an embodiment, the decoding stage 22B comprises a supplementary logic gate 25 having a first and a second input terminal connected to the SRAM cells 13a and 13b and an output terminal connected to the gate terminal $G_{MZ}$ of the pull down transistor MZ.

In essence, only the transistors being connected at the input to the buffer stage 23 (i.e. the transistors of the first transistor stage 21A and the pull down transistor MZ) are driven by means of the decoding realized by the logic gates $24_1$-$24_3$ and 25.

In this way, the decoding stage 22B enables the activation of up to three connections and it is thus particularly suitable for applications in networks of the multi-fanout type, however maintaining the number of SRAM cells necessary for the memorization of the configuration data is limited to five.

In the perspective of minimizing the area occupation of such decoding logic 22, it is also possible to realize SRAM cells of the multi-context type by using pairs of transistors suitable to connect a plurality of bistables to single read and write lines, as schematically shown in FIG. 10, as described in the Italian patent application No. MI2003A 000276 filed on Feb. 14, 2003 to the same Applicant.

In particular, a SRAM cell 13 comprises a plurality of write transistors MW1-MWK, connected between a write line WL and a plurality of bistables BS1-BSK for the memorization of the data, in turn connected to a plurality of read transistors MR1-MRk.

In this way, as it is typically necessary in the case of multi-context FPGA architectures, the write transistors MW1-MWk and the read transistors MR1-MRk are driven in an independent way, to execute a write phase of a cell while another one is in the read phase, giving high flexibility, in terms of reconfiguration, to the architecture itself.

Advantageously, read transistors MR1-MRk are chosen with minimal size, only write transistors MW1-MWk, needing to have adequate sizes to allow the writing in the bistables BS1-BSk, obtaining in such way a memory cell structure with a minimal silicon area occupation.

At the output from the read transistors MR1-MRk, in correspondence with a read line RL, a single level-shifter buffer 26 is also inserted suitable to recover a threshold value and to supply pairs of normal values being complementary on a first Out and a second output terminal Out* to supply the decoding stage 22.

In particular, the level-shifter buffer 26 comprises a transistor Mb inserted between a supply voltage reference Vdd and the read line RL and having a gate terminal connected to the first output terminal Out of such level-shifter buffer 25.

Between the first output terminal Out and the second output terminal Out*, this latter directly connected to the read line RL, an inverter Ib is suitably inserted.

The following Table I reports the total number of transistors-equivalents T necessary for the realization of a switch block by using known configurations and the proposed configuration, showing the considerable improvement in terms of number of necessary transistors and thus of integration area. In particular, the following area occupations have been considered in terms of transistor-equivalent:

single context SRAM cell (Ss)=6T
n contexts SRAM cell (Sm)=6nT+3
Buffer (B)=29T
transistors at the input of the buffer (Ti)=8.5T
transistors at the output of the buffer (To)=1T
decoder (D)=30T
obtaining to following values when the number of contexts grows:

TABLE I

| Switch block | Area profile | Number of contexts (n) | | | |
|---|---|---|---|---|---|
| | | 1 | 2 | 4 | 8 |
| switch with sole pass-transistors (FIG. 5A) S1 | 6S + 6To | 87 | 126 | 198 | 342 |
| switch with pass transistor and three-state buffer (FIG. 5B) S2 | 12S + 12B + 12To | 486 | 597 | 741 | 1029 |
| switch with multiplexer (U.S. Pat. No. 5,376,844) S3 | 12S + 4B + 4To + 16Ti | 238 | 313 | 457 | 745 |
| proposed solution - switch with decoding NEW1 | 3S + 1B + 3To + 4Ti + D | 107 | 128 | 164 | 236 |

The advantage obtained with the switch block 20 is more and more evident when the number of contexts grows. In particular, in the case of FPGA architectures with four contexts, the switch block 20 occupies from ⅓ to ¼ of the area occupied by the blocks realized according to the known solutions, as shown also in FIG. 11, which reports the results obtained for the switch block 20 by using the decoding stage 22A of FIG. 9A (NEW1) and the decoding stage 22B of FIG. 9B (NEW2), respectively.

It should also be noted that, even in the case of FPGA architectures with single context, the design proposed for the switch block 20 is still the solution having the smallest area occupation.

Finally, it is immediate to verify that the propagation delay of the switch block 20 is substantially equivalent to that of a switch block comprising multiplexer realized according to the prior art, no excessive slowdown of the signals being introduced by the configuration of transistors with logic gates used.

An embodiment of the present invention also makes reference to a new configuration for a switch matrix suitable to connect a plurality of vertical and horizontal connection paths, each comprising a plurality of horizontal 4a and vertical 4b interconnection lines, schematically shown in FIG. 12 and indicated with 31.

In particular, in the example shown in FIG. 12, each switch matrix 31 configures three vertical connection paths PV1-PV3 and three horizontal connection paths PO1-PO3.

Advantageously, a switch matrix 31 comprises:

a first T-switch block (indicated in the figure with T1), realized as above described and comprising a first buffer stage to connect a first vertical interconnection line lv1 and a second interconnection line lv2 of the first vertical connection path PV1 to a first central node XO1 of the first horizontal connection path PO1;

a second L-switch block (indicated in the figure with PS), which can be realized by means of a simple pass transistor, to connect a second central node XV1 of the second vertical connection path PV2 and a third central node XO2 of the second horizontal connection path PO2; and a third T-switch block (indicated in the figure with T2), realized as above described and comprising a second buffer stage to connect a first horizontal interconnection line lo1 and a second horizontal interconnection line lo2 of the third horizontal connection path PO3 to a fourth central node XV2 of the third vertical connection path PV3.

It is to be noted that the term 'switch matrix' has been used to indicate a configuration suitable to connect a plurality of horizontal and vertical lines to each other, in contrast with the term 'switch block' used to indicate a single element which suitably connects a horizontal line with a vertical line.

It is possible to use a plurality of switch matrixes 31 as shown to realize an interconnection network of an FPGA architecture comprising T-switch blocks realized as previously described, schematically shown in FIG. 12 and globally indicated with 30.

The interconnection network 30 comprises a plurality of switch matrixes 31 being identical to each other and organized in a matrix system of rows 30a and columns 30b. The number of switch matrices at the intersection of each row with each column can be any number, and FIG. 12 shows only one by way of illustration. Through the insertion of a suitable number of switch matrices any number of horizontal interconnection lines 4a and vertical interconnection lines 4b can be connected to each other.

As it has been seen, each switch matrix 31 configures three vertical connection paths PV1-PV3 and three horizontal connection paths PO1-PO3 in a scheme which is repeated as such in the whole addressing network 30.

Moreover, each switch matrix 31 is output connected to a further switch matrix 31a successive thereto in a same row 30a so that the first horizontal connection path PO1 of the switch matrix 31 is connected to a second horizontal connection path of the successive switch matrix 31a, the second horizontal connection path PO2 of the switch matrix 31 is connected to a third horizontal connection path of the successive switch matrix 31a, and the third horizontal connection path PO3 of the switch matrix 31 is connected to a first horizontal connection path of the successive switch matrix 31a. In the case wherein six horizontal interconnection lines have to be suitably interconnected, two switch matrices being identical to each other are used, each of them being connected to a subgroup of three adjacent horizontal interconnection lines. The horizontal connection paths relative to two switch matrices which are on two adjacent columns are connected in a very similar way with respect to what has been described in the previous case. Similarly, this scheme of connections can be extended for a FPGA having any number of horizontal interconnection lines.

In a similar way, each switch matrix 31 is output connected to a further switch matrix 31b successive thereto in a same column 30b so that the first vertical connection path PV1 of the switch matrix 31 is connected to a second vertical connection path of the successive switch matrix 31b, the second vertical connection path PV2 of the switch matrix 31 is connected to a third vertical connection path of the successive switch matrix 31b, and the third vertical connection path PV3 of the switch matrix 31 is connected to a first vertical connection path of the successive switch matrix 31b. In the case of FPGA having a number of vertical interconnection lines being higher than three, a suitable number of switch matrices being identical to each other is used, each of them being connected to a subgroup of three adjacent vertical interconnection lines.

Following the scheme indicated in FIG. 12, independently from the programming of the switch matrix, the connection between whatever two reconfigurable logic SRAM cells will cross, in an alternated way, a switch block of the type of FIG. 6, comprising a buffer stage 23, and an L-switch block only comprising a pass-transistor. In such way, a priori, for any type of programming, the sequences of different pass-transistors are avoided, which increase the propagation delay. Moreover, the alternation of buffer and pass-transistor on any path and for any programming simplifies the calculation of the propagation delay.

An embodiment of the present invention also makes reference to a new configuration of an FPGA architecture realized by means of a plurality of elementary blocks 33 of the type shown in FIG. 13, arranged in a matrix structure organised in rows and columns and advantageously interconnected to each other by the interconnection network 30.

In particular, each elementary block 33 comprises a programmable logic element 36 connected to a horizontal connection block 34 and to a vertical connection block 35, being advantageously connected to each other by a switch matrix 31.

The programmable logic element 36 comprises, in particular, an input logic block 37 connected to a first 38a and to a second look up table 38b, in turn connected to an output register block 39.

An FPGA architecture is particularly advantageous, realized with connection blocks 34, 35 as described in the above cited Italian patent application No. MI2003A 000276 filed on Feb. 14, 2003 to the same Applicant. The configuration described in such application for the vertical and horizontal connection blocks allows in fact to reduce the number of SRAM cells used for programming multi-context FPGA to a minimum, reducing in such way the area occupation of the overall architecture to a minimum level.

Experimental tests carried out by the Applicant have allowed to evaluate the efficiency of a T-switch block and a switch matrix realized according to an embodiment of the present invention. In particular, the case of a four-context FPGA architecture has been considered, which uses thirty horizontal interconnection lines, thirty vertical interconnection lines, a reconfigurable logic cell of the type 36 shown in FIG. 13, having eight inputs and four outputs. The results of such experimental tests on single elementary blocks 33 of the type shown in FIG. 13 are shown in FIGS. 14A and 14B, in terms of area occupation and of propagation delay average time, respectively, by means of a comparison with the known solutions previously indicated with S2 and S3 and with the switch block 20 according to an embodiment of the invention and indicated with NEW, by using or not the configuration for the interconnection blocks described in the above cited Italian patent application No. MI2003A 000276 indicated with DBM.

From FIGS. 14A and 14B, it can be verified that, by using the switch block 20, the elementary block 33 shows a reduction of area from 13% to 26% with a substantial maintenance of the propagation delay average time, making such T-switch block 20 an ideal circuit solution in the case of multi-context FPGA architectures.

The switch block 20 may be disposed on an integrated circuit (IC), which may be part of a larger system such as a computer system.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A switch block realizing the connection between interconnection lines connected thereto and comprising:
    at least a switching block connected to the interconnection lines and including at least a buffer stage, wherein the switching block further comprises at least a first transistor stage inserted between a first line of the interconnection lines and an input terminal of the buffer stage and connected to a central node of a second line of the interconnection lines, as well as to a third line of the interconnection lines;
    a plurality of transistors connected to the buffer stage; and
    a decoding stage inserted between a plurality of SRAM cells and respective control terminals of the plurality of transistors of the switching block.

2. The switch block according to claim 1, wherein the first transistor stage comprises:
    a first transistor of the plurality of transistors inserted between the first line and the input terminal of the buffer stage;
    a second transistor inserted between the central node of the second line and the input terminal of the buffer stage; and
    a third transistor of the plurality of transistors inserted between the third line and the input terminal of the buffer stage.

3. The switch block according to claim 2, wherein the transistors comprised in the switching block are of the NMOS type.

4. The switch block according to claim 1, wherein the switching block further comprises a second transistor stage inserted between an output terminal of the buffer stage and the third line and connected to the central node of the second line, as well as to the first line.

5. The switch block according to claim 4, wherein the second transistor stage comprises:
    a fourth transistor inserted between the first line and the output terminal of the buffer stage;
    a fifth transistor inserted between the central node of the second line and the output terminal of the buffer stage; and
    a sixth transistor inserted between the third line and the output terminal of the buffer stage.

6. The switch block according to claim 5, wherein the decoding stage comprises a plurality of logic gates having a first and a second input terminal connected, in an alternate way, to a first and to a second SRAM cell of the plurality of SRAM cells and respective output terminals connected to the control terminals of the transistors comprised in the first transistor stage of the switching block, as well as further SRAM cells directly connected to the control terminals of the transistors comprised in the second transistor stage of the switching block.

7. The switch block according to claim 6, wherein the decoding stage comprises a supplementary logic gate having a first and a second input terminal connected to the first and second SRAM cell and an output terminal connected to the control terminal of the pull down transistor.

8. The switch block according to claim 1, wherein the decoding stage comprises a plurality of logic gates having a first and a second input terminal connected, in an alternate way, to the SRAM cells and respective output terminals connected to the control terminals of the transistors comprised in the switching block.

9. The switch block according to claim 8, wherein the decoding stage further comprises a supplementary logic gate having three inputs connected to respective output terminals of three of the logic gates and an output terminal connected to a control terminal of a pull down transistor comprised in the switching block and inserted between an input terminal of the buffer stage and a voltage reference.

10. The switch block according to claim 9, wherein the supplementary logic gate is input connected to output terminals of three of the logic gates in turn connected to control terminals of transistors comprised in a second transistor stage in turn comprised in the switching block and inserted between an output terminal of the buffer stage and the third line and connected to the central node of the second line, as well as to the first line and to the output terminal of the buffer stage.

11. A switch block realizing the connection between interconnection lines connected thereto and comprising:
at least a switching block connected to the interconnection lines and including at least a buffer stage, wherein the switching block further comprises a pull down transistor inserted between an input terminal of the buffer stage and a voltage reference;
a plurality of transistors connected to the buffer stage; and
a decoding stage inserted between a plurality of SRAM cells and respective control terminals of the plurality of transistors of the switching block.

12. The switch block according to claim 11, wherein the pull down transistor has a gate terminal connected to the decoding stage and is driven to connect the input terminal of the buffer stage to the voltage reference in the absence of signals on the input terminal.

13. The switch block according to claim 11, wherein the pull down transistor comprised in the switching block is of the NMOS type.

14. A switch circuit, comprising;
first, second, and third nodes;
six switches for intercoupling the nodes; and
a control circuit coupled to the switches and operable to,
close a first switch coupled to the first node and a second switch coupled to the second node to allow a signal to propagate from the first node to the second node;
close a third switch coupled to the second node and a fourth switch coupled to the first node to allow a signal to propagate from the second node to the first node;
close a fifth switch coupled to the second node and the fourth switch coupled to the third node to allow a signal to propagate from the second node to the third node;
close a sixth switch coupled to the third node and the second switch coupled to the second node to allow a signal to propagate from the third node to the second node;
close the first switch coupled to the first node and the fifth switch coupled to the third node to allow a signal to propagate from the first node to the third node; and
close the third switch coupled to the third node and the sixth switch coupled to the first node to allow a signal to propagate from the third node to the first node.

15. The switch circuit of claim 14, wherein:
the first node is operable to connect to an end point of a first connection line;
the second node is operable to connect to an intermediate point of a second connection line; and
the third node is operable to connect to an end point of a third connection line.

16. The switch circuit of claim 14, wherein the first, second, third, fourth, fifth and sixth switches are coupled such that the signals all propagate through a common buffer.

* * * * *